United States Patent
Guthrie et al.

(10) Patent No.: US 11,067,611 B2
(45) Date of Patent: Jul. 20, 2021

(54) METHOD FOR SENSING INDUCTOR CURRENT ACROSS RANGE EXCEEDING ADC DYNAMIC RANGE AND PWM CONTROLLER SYSTEM INCLUDING ADC THEREFOR

(71) Applicant: RENESAS ELECTRONICS AMERICA INC., Milpitas, CA (US)

(72) Inventors: Travis Guthrie, Austin, TX (US); Narendra Kayathi, Austin, TX (US)

(73) Assignee: Renesas Electronics America Inc., Milpitas, CA (US)

( * ) Notice: Subject to any disclaimer, the term of this patent is extended or adjusted under 35 U.S.C. 154(b) by 133 days.

(21) Appl. No.: 16/357,212

(22) Filed: Mar. 18, 2019

(65) Prior Publication Data

US 2019/0293695 A1 Sep. 26, 2019

Related U.S. Application Data

(60) Provisional application No. 62/645,640, filed on Mar. 20, 2018.

(51) Int. Cl.
| | | |
|---|---|---|
| *G01R 19/257* | (2006.01) | |
| *H03F 3/217* | (2006.01) | |
| *G01R 19/00* | (2006.01) | |
| *H02M 3/157* | (2006.01) | |
| *G01R 19/25* | (2006.01) | |

(52) U.S. Cl.
CPC ....... *G01R 19/257* (2013.01); *G01R 19/0023* (2013.01); *G01R 19/0038* (2013.01); *G01R 19/0092* (2013.01); *G01R 19/2506* (2013.01); *H02M 3/157* (2013.01); *H03F 3/2175* (2013.01)

(58) Field of Classification Search
CPC ............ G01R 19/0023; G01R 19/0038; G01R 19/0092; G01R 19/2506; G01R 19/2509; G01R 19/2513; G01R 19/257; G01R 19/25; G01R 31/40; H02M 2001/0009; H02M 3/156; H02M 3/157; H02M 3/1584; H03F 3/2175; H03F 3/2178; H03M 1/186; H03M 1/121; H03M 1/126; G06F 1/3206

See application file for complete search history.

(56) References Cited

U.S. PATENT DOCUMENTS

| | | | | |
|---|---|---|---|---|
| 5,594,631 | A * | 1/1997 | Katoozi | ................ H02M 3/157 323/283 |
| 8,494,180 | B2 | 7/2013 | Guthrie et al. | |
| 8,797,011 | B2 * | 8/2014 | Li | ........................... H02M 1/32 323/284 |
| 8,810,228 | B2 * | 8/2014 | Kim | ..................... B60L 3/0038 323/285 |
| 9,419,627 | B2 | 8/2016 | Guthrie et al. | |
| 9,588,157 | B2 * | 3/2017 | Alcouffe | ................. B60T 8/176 |
| 9,667,260 | B2 | 5/2017 | Guthrie et al. | |
| 9,977,057 | B2 * | 5/2018 | Guthrie | ............. G01R 19/2506 |
| 10,574,253 | B1 * | 2/2020 | Guthrie | ................ H03M 1/126 |

\* cited by examiner

*Primary Examiner* — Vinh P Nguyen
(74) *Attorney, Agent, or Firm* — Foley & Lardner LLP

(57) ABSTRACT

According to certain aspects, a predictive tracking scheme is provided for sampling inductor currents in a digital PWM controller used for high-bandwidth voltage regulation. In one or more embodiments, the predicted current derived from the PWM waveform is fed forward to the current sense ADC in order to reduce the required conversion range. These and other embodiments only need to convert a few of the LSB of the ADC in order to correct the largest error expected in the synthesizer.

20 Claims, 7 Drawing Sheets

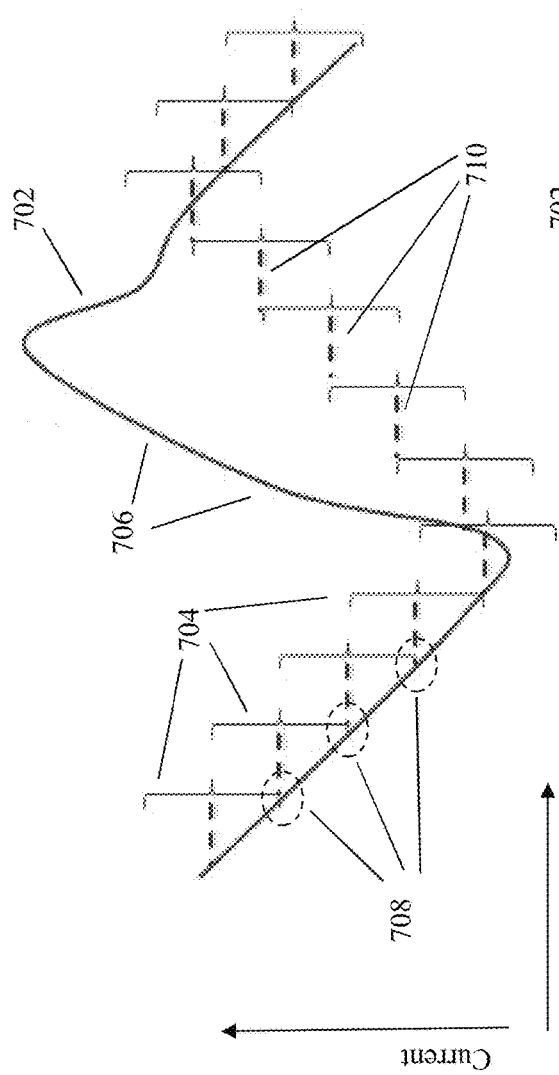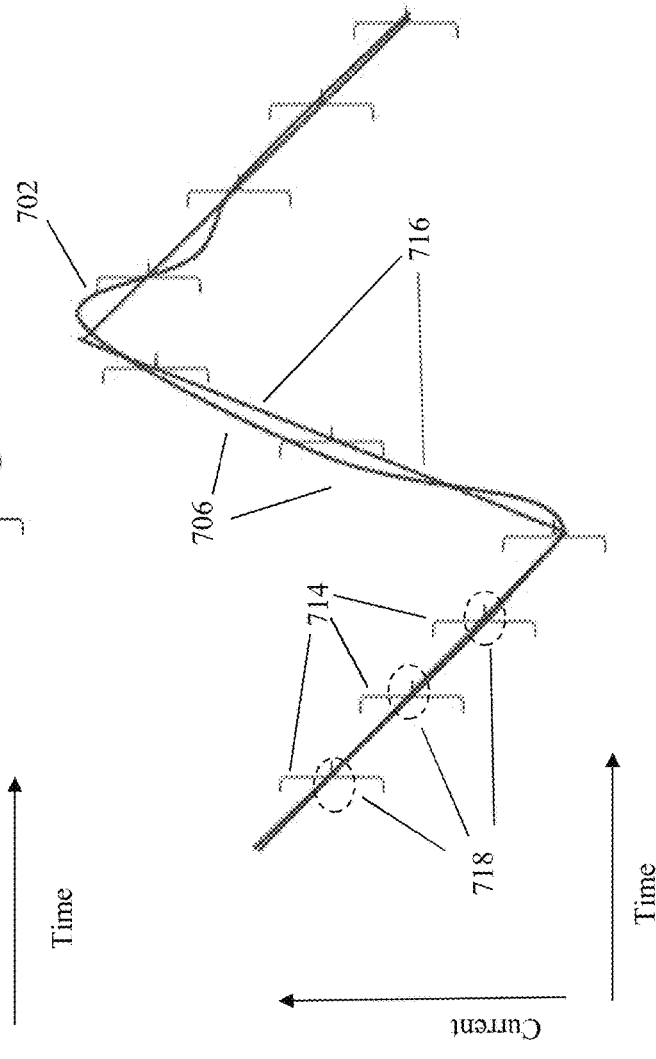
FIG. 7A
FIG. 7B

METHOD FOR SENSING INDUCTOR CURRENT ACROSS RANGE EXCEEDING ADC DYNAMIC RANGE AND PWM CONTROLLER SYSTEM INCLUDING ADC THEREFOR

CROSS-REFERENCE TO RELATED APPLICATIONS

The present application claims priority to U.S. Provisional Application No. 62/645,640 filed Mar. 20, 2018, the contents of which are incorporated herein by reference in their entirety.

TECHNICAL FIELD

The present embodiments relate generally to power converters and more particularly to performing predictive tracking of inductor current sensing using an analog-to-digital converter (ADC) in a PWM controller.

BACKGROUND

Digital power management products sample the current signal (e.g., the inductor current) in order to incorporate droop and compensate the loop. In general, a full range ADC is used and all bits are converted on every sample. A problem with this approach is that for high resolution and high bandwidth loop designs a system requires both a very high resolution ADC, and many updates (to quickly correct the synthesizer upon load steps). Accordingly, a need exists for a solution to these and other problems.

SUMMARY

According to certain aspects, a predictive tracking scheme is provided for sampling inductor currents in a digital PWM controller used for high-bandwidth voltage regulation. In one or more embodiments, the predicted current derived from the PWM waveform is fed forward to the current sense ADC in order to reduce the required conversion range. These and other embodiments only need to convert a few of the LSBs of the ADC in order to correct the largest error expected in the synthesizer. This allows for use of a lower frequency clock to achieve the same level resolution in order to lower system power and/or increase sample frequency, for example. One aspect of this solution is to feedback the synthesized current, which itself is highly accurate, to the ADC which is going to convert a current measurement signal used to correct the synthesized current. Since the synthesized current is so accurate, the error is generally small, and therefore the only bits of the ADC that need to be converted correspond to the maximum amount of error of the synthesizer since the last conversion.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIGS. 7A and 7B are timing diagrams illustrating example aspects of the predictive current sensing technique of the present embodiments.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments provide an efficient scheme for predictive tracking of inductor currents in a digital PWM controller used for high-bandwidth voltage regulation. Some embodiments feed forward the predicted current derived from the PWM waveform to the current sense ADC in order to reduce the required conversion range, while being able to correct the largest error expected in the synthesizer. This allows for use of a lower frequency clock to achieve the same level resolution in order to lower system power and/or increase sample frequency, for example. Since the synthesized current is relatively accurate, the error between the synthesized current and actual current is generally small, and therefore the number of bits of the ADC that need to be converted correspond to the maximum error of the synthesizer since the last conversion.

Figure 1:
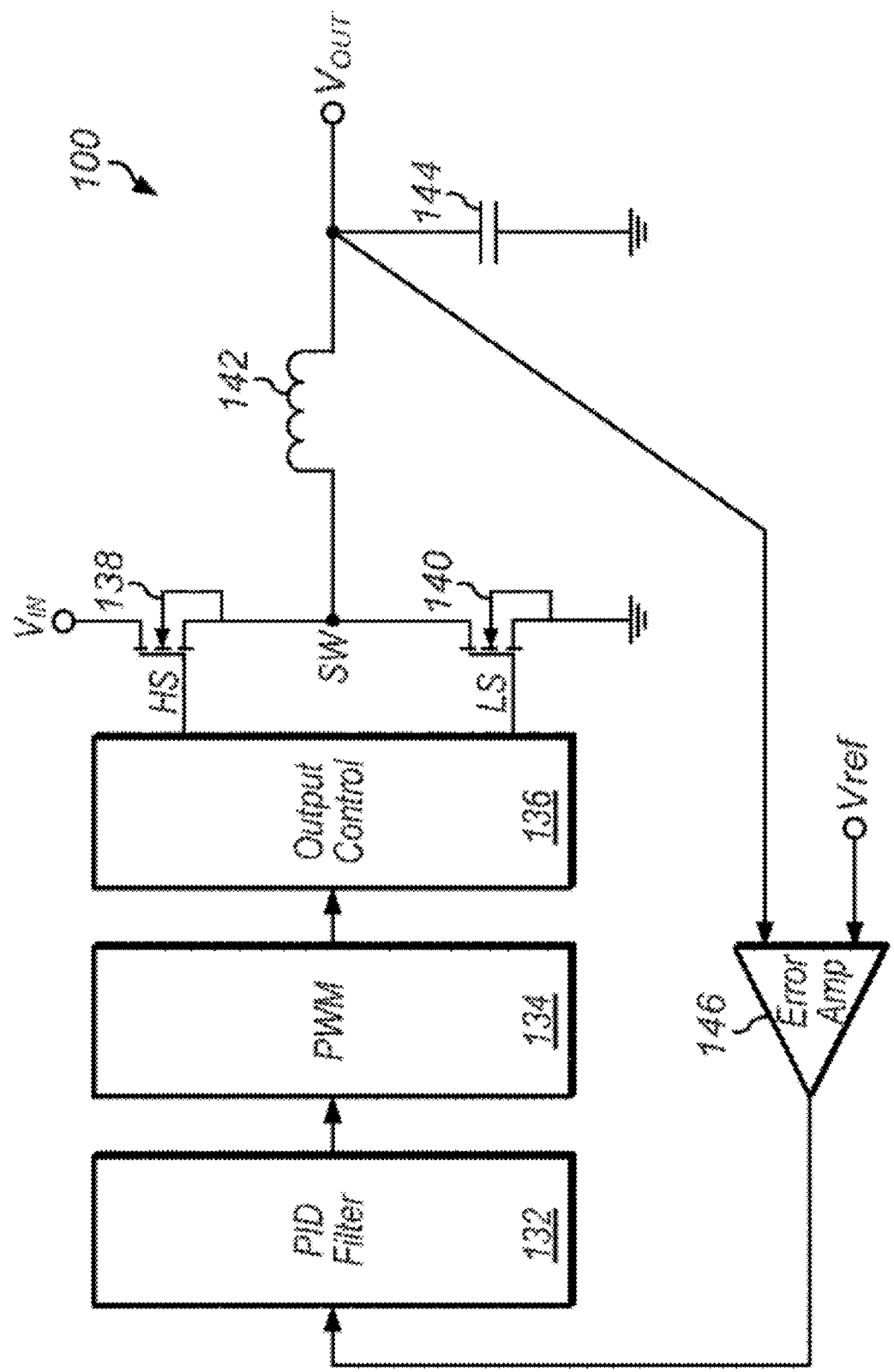
FIG. 1 is an example system block diagram of a controller according to embodiments.

By way of background, DC-to-DC voltage conversion is often performed by switching voltage regulators, or stepdown regulators, also referred to as voltage converters, point-of-load regulators, or power converters, converting an input voltage $V_{IN}$ to a regulated output voltage $V_{OUT}$ as required by one or more load devices. More generally, voltage regulators and current regulators are commonly referred to as power converters, and as used herein, the term power converter is meant to encompass all such devices. Switching voltage regulators often use two or more power transistors to convert energy at one voltage to another voltage. One common example of such a voltage regulator 100, commonly called a "Buck Regulator" is shown in FIG. 1. Buck Regulator 100 is a switching regulator (or switching power converter) that typically switches a pair of power transistors (138 and 140) connected between $V_{IN}$ and Ground in order to produce a square-wave at the transistors' common node SW. The produced square-wave can be smoothed out using an LC circuit comprising inductor 142 and capacitor 144 to produce the desired voltage, $V_{OUT}$. A feedback control loop, including an Error Amplifier 146, a Proportional-Integral-Differential (PID) control filter 132, a Pulse-Width-Modulator (PWM) 134, and an Output Control circuit 136 (which includes the drive circuitry to drive high-side and low-side FETs 138 and 140, respectively), can be configured to control the duty-cycle of the output square-wave, and hence the resulting value of $V_{OUT}$ based on the input voltage $V_{IN}$. It should be noted that although the present embodiments will be described in connection with an example application in a buck regulator, this is not limiting. Rather, the present embodiments can also be practiced in other types of regulators such as buck-boost and boost regulators.

Voltage regulators in which the principles of the present embodiments can find useful application, such as regulator 100, are sometimes included in a current share configuration in which power is distributed through shared voltage supplies. Distributed power through shared point of load supplies has a number of compelling advantages over a single point of load supply, or regulator. Distributed power or current sharing may be used to accommodate the ever increasing current demands associated with low voltage applications through better efficiency over a wide range of output currents, reliability through redundancy, and distributed heat dissipation.

Figure 2:
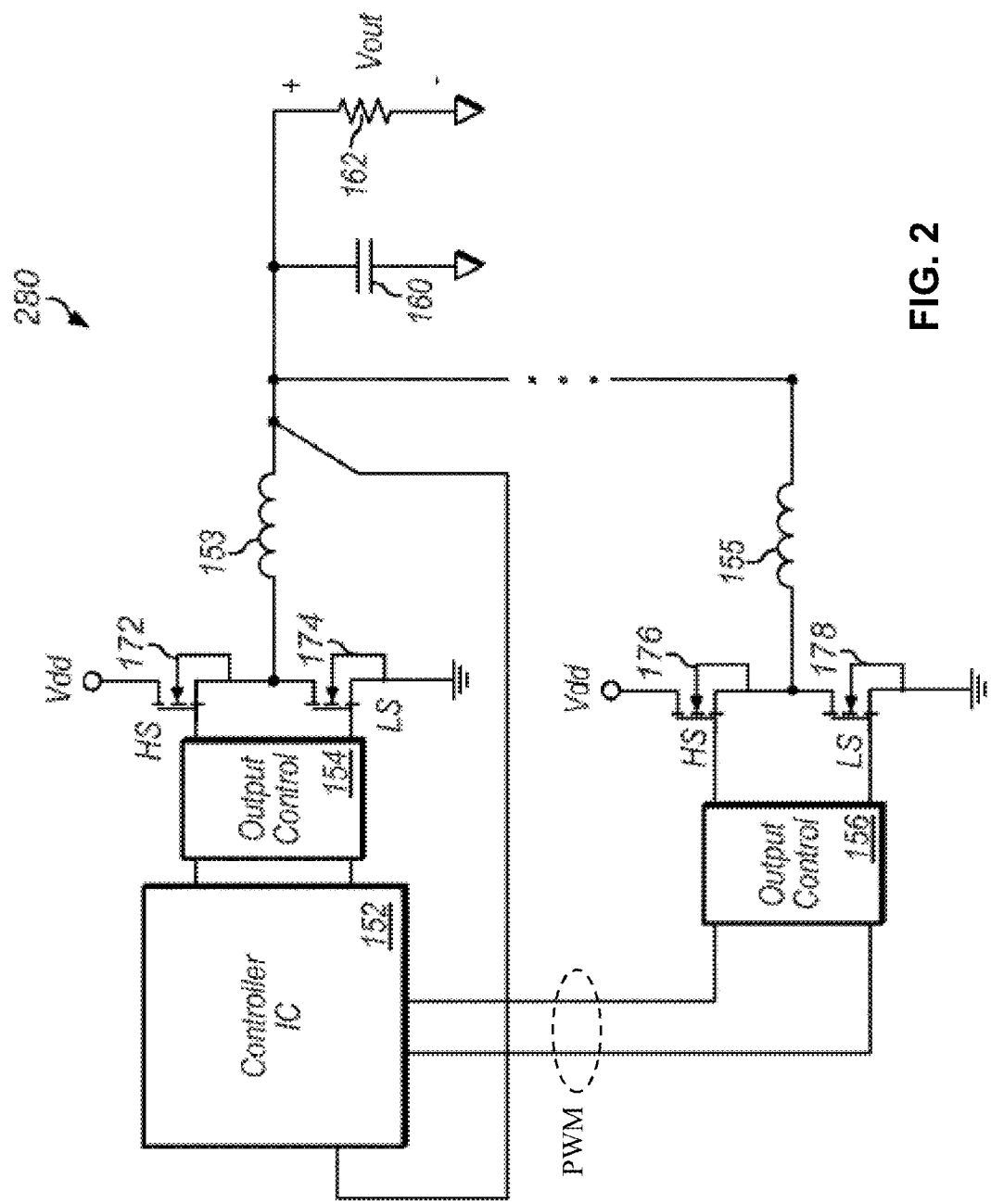
FIG. 2 is a block diagram illustrating an example implementation of a controller such as that shown in FIG. 1.

One example of a current sharing configuration is shown in FIG. 2. As shown in FIG. 2, multiphase regulator 280 contains multiple output stages (two stages 154 and 156 are shown in this example) with FET-pairs (172/174 and 176/178) and inductors (153 and 155). Output stages 154, 156 provide a single output voltage $V_{OUT}$ (at capacitor 160, to exemplary load 162 for example), and a single controller (for example, a controller IC 152) may be used with a single input for voltage feedback $V_{FB}$, a single compensator (i.e. PID) and multiple PWM outputs (e.g. multiple instances of PWM 134). The multiple PWM outputs may be provided to respective output stages (i.e. drive circuits) 154 and 156. In some embodiments, the output stages may be commonly implemented by a single circuit or IC, or the output stages may also be included in controller IC 152. The inter-phase communication bus in multiphase regulator 280 may be contained within the controller 152, allowing high-bandwidth current sharing in a digital controller. While only two output stages (i.e. phases) are shown in the embodiment of FIG. 2, various embodiments may include more output stages arranged in a manner similar to those shown. Those skilled in the art will appreciate that various illustrations of the converters (or voltage regulators) and voltage regulator systems disclosed herein are meant to embody all possible implementations in accordance with the principles set forth herein.

In many regulators, information about the current (e.g. the current in inductor 142 in voltage supply/regulator 100) is integral to servicing many of the functions in a PWM controller (such as PWM controller 134 in FIG. 1 or controller 152 in FIG. 2). These functions include voltage accuracy, transient response, current balance, circuit fault protection, and telemetry. Obtaining high-quality inductor current information to support these functions can be among the more challenging requirements of a controller IC design. Quality may be quantified in terms of accuracy, precision, bandwidth and latency. High quality comes from high accuracy, high precision, high bandwidth and/or low latency.

Synthesizing inductor current from known system parameters can mitigate much of the challenge of obtaining current information over current measurement alone. This is due to the fact that the dynamic component of current in an inductor (i.e., how the current changes with respect to time) may be calculated from system parameters that can be far less challenging to obtain with high precision than it would be to obtain the value of the current itself. The first order system parameters include the voltage across the inductor and the inductance value, [di/dt=V/L]. A more accurate calculation may include inductor and/or switch losses. And a still more sophisticated calculation may include non-linearities or parameter drift over time. All of these characteristics may be either estimated or measured with relatively low cost in circuit area and power consumption. More sophisticated calculations improve the quality of synthesized information, but come at the expense of computation circuit area and power consumption. Higher quality synthetic (or calculated) information can lower the cost of the measurement circuitry needed to provide the missing steady-state inductor current component. In a system where the synthesizer is designed in digital logic, and steady-state inductor current is measured using a mostly analog circuit, the overall cost and power optimization is benefitted by scaling applied according to Moore's Law. This approach to obtaining output current information may be very attractive for digital power controllers. Nevertheless, even in controllers including current synthesizers as described above, accurate inductor current measurements are still needed for synthesizer current correction and other functions.

Figure 3:
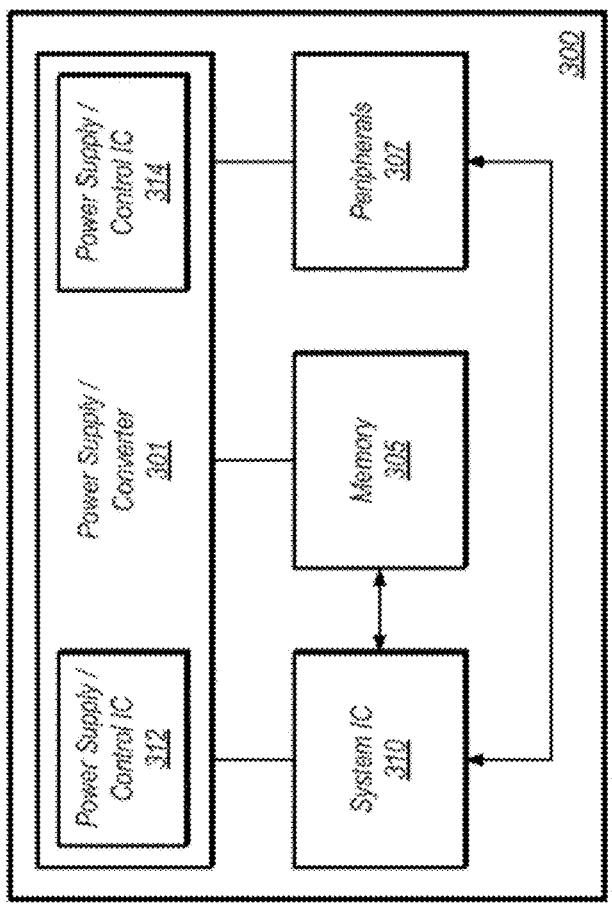
FIG. 3 is a block diagram illustrating an example system having a power supply including a controller such as that shown in FIG. 1.

Overall, various embodiments of regulators disclosed herein may include power supply (or power converter or voltage regulator) control circuitry designed to help optimize operation of switching regulators/supplies, including accurate current synthesis that is improved using accurate current measurements. FIG. 3 shows a block diagram of one embodiment of a system 300 that includes a power supply 301 designed according to the principles described herein, and which will be further detailed below. The system 300 includes at least one instance of a power supply/regulator 301 providing one or more supply voltages to the system integrated circuit (or processing element) 310, one or more peripherals 307 and memory subsystem (or memory) 305. Memory 305 may include, for example, programming instructions that may be executable by processing element 310 to perform various system functions, which may also include controlling and/or operating peripherals 307.

In some embodiments, more than one instance of power supply/converter 301 may be included. Furthermore, regulator 301 may include one or more power supply control integrated circuits, such as power supply control ICs 312 and 314. Power supply control ICs 312 and 314 may include various components such as feedback control circuitry, PWM modulation circuitry, output stage control circuitry and the like. Furthermore, in some embodiments the control circuitry may not be included on a separate IC or ICs and may simply be a part of power supply 301. Overall, various embodiments of power supply 301 may be divided into two major components, the driving stage that includes high-side and low-side FETS, and the control circuitry encompassing elements performing control of the drive signals driving the FETs in the output stage. As shown in FIG. 3, the control circuitry is embodied in the form of an IC that may couple to either a driving stage (such as output control stage 136 shown in FIG. 1), or it may couple directly to high-side FET(s) and low-side FET(s) such as FETs 138 and 140 in FIG. 1. In some embodiments system 300 may itself be a system on a chip (SOC) whereby system 300 is an IC, with all components, including those of power supply 301 and power supply control ICs 312 and/or 314 a part of the same IC.

The peripherals 307 may include any desired circuitry, depending on the type of system. For example, in one embodiment, the system 300 may be included in a mobile device (e.g., personal digital assistant (PDA), smart phone, etc.) and the peripherals 307 may include devices for various types of wireless communication, such as Wi-Fi, Bluetooth, cellular, global positioning system, etc. The peripherals 307 may also include additional storage, including RAM storage, solid-state storage, or disk storage. The peripherals 307 may include user interface devices such as a display screen, including touch display screens or multi-touch display screens, keyboard or other input devices, microphones, speakers, etc. In other embodiments, the system 300 may be included in any type of computing system (e.g. desktop personal computer, laptop, workstation, net top etc.). Furthermore, the system memory 305 may include any type of memory.

Figure 4:
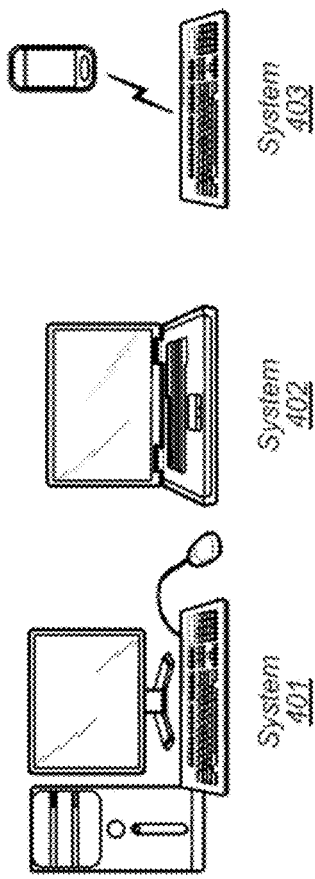
FIG. 4 illustrates example computing systems incorporating a power supply such as that shown in FIG. 3.

Several embodiments of computing systems that may include all or part of system 300, and more specifically power supply 301 and/or Power supply control ICs 312 and/or 314 are illustrated in FIG. 4. System 401 may represent a desktop computer, system 402 may represent a laptop computer, and system 403 may represent a tablet or smartphone with a wireless keyboard. System 401 may include one or more human interface devices (HIDs), such as a keyboard, a mouse, a microphone, a camera, etc. Systems 402 and system 403 may include similar HIDs to system 401. Other devices not illustrated, such as smart televisions or video game consoles may also include various forms or embodiments of a power supply or power supply controller such as those disclosed herein. It is noted that the computer systems illustrated in FIG. 4 are merely provided as examples. Other types of systems with power supplies/regulators and Power supply control ICs are possible and contemplated.

Among other things, and as mentioned above, the present Applicant recognizes that sensing and/or synthesizing inductor current (e.g. the currents in inductor 142 in FIG. 1 or inductors 153, 155 in FIG. 2) accurately poses many challenges, while providing substantial benefits.

Figure 5B:
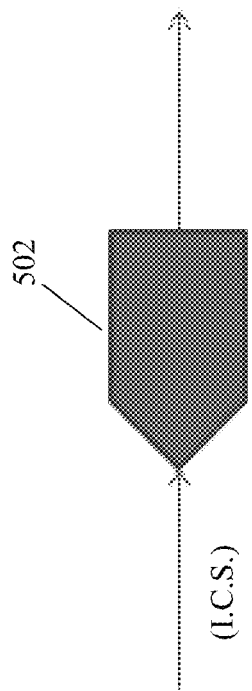
FIGS. 5A to 5C are block diagrams illustrating example techniques for sensing an inductor current in a controller.
Figure 5C:
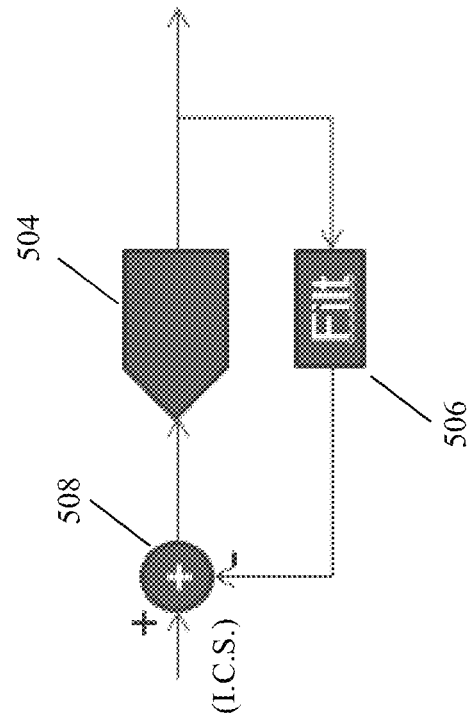
Figure 5A:
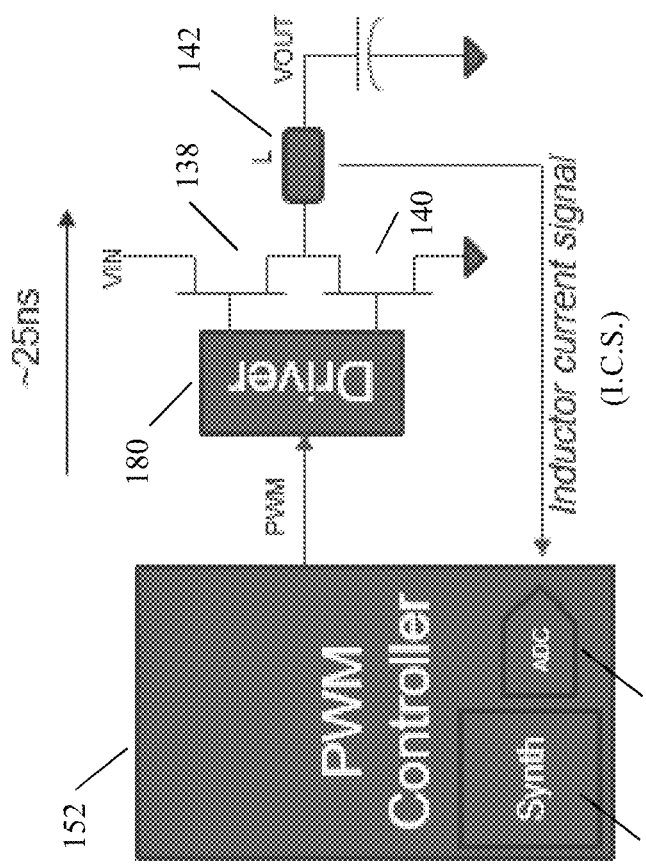

In the example shown in FIG. 5A, PWM controller 152 includes a current synthesizer 182 and an ADC 184. As set forth above, inductor current can be synthesized (i.e. predicted or estimated) by synthesizer 182 from the PWM waveform provided to output driver 180 and a few known or measurable parameters, including the Input Voltage VIN, the Output Voltage VOUT, and the Inductance L. As further set forth above, synthetic current has the advantage of being zero or even negative latency. For example, the parameters used for current synthesis are known in the PWM controller before they get imposed on the inductor. In particular, the values of VIN and VOUT move relatively slowly. The value of L is relatively static, and changes can be modeled in the synthesizer. Furthermore, as illustrated in FIG. 5A, the PWM waveform produced by controller 152 has a latency of tens of nanoseconds to the power FETs 138 and 140.

Meanwhile, the present Applicant further recognizes that current samples from ADC 184 can be used for correcting the parameters used for synthesis by synthesizer 182, for example using techniques described in U.S. Pat. No. 9,419,627, the contents of which are incorporated by reference herein in their entirety. Moreover, the synthesized current, after being corrected by the measured current as described in more detail hereinbelow, can provide an even more accurate estimate of the actual inductor current, which estimate can improve the operation of other components of PWM controller 152 which rely on the inductor current for loop compensation, etc.

FIG. 5B is one possible implementation of ADC 184 that can be included in PWM controller 152 according to embodiments. In this example, ADC 184 is implemented by a conventional full-range ADC 502, in which the ADC dynamic range equals the full quantizer dynamic range of the ADC 502. In other words, if ADC 502 is a 14-bit ADC, all 14 bits of its digital output will be generated by ADC 502 on every sample, and the ADC 502 is preferably able to generate digital output values across all of the possible analog values of the inductor current sense signal (I.C.S.).

FIG. 5C is another possible implementation of ADC 184 that can be included in PWM controller 152 according to embodiments. In this example, ADC 184 is implemented by a tracking ADC 504, in which the historical data from filter 506 (e.g., a sample and hold buffer and/or digital to analog converter) is subtracted from the input inductor current signal (I.C.S.) by 508. In this example implementation, the ADC 184 dynamic range can be greater than the quantizer dynamic range of ADC 504 (i.e., instead of using a 14-bit ADC, an ADC with a lower number of bits can be used, because it only needs to convert the difference between the past and present values of I.C.S.). This increase in overall dynamic range can be leveraged for lower power, area or higher sample rate. However, this implementation has a dV/dt limitation on the input. More particularly, for ADC 504 to provide a useful digital sample, the difference between the last and present values of the I.C.S., as provided by 508 as an input to ADC 504, cannot exceed the quantizer range of ADC 504. So if the current (and corresponding analog voltage value of I.C.S.) is changing by large amounts relatively quickly (i.e. a high dV/dt rate), ADC 504 will saturate and will be unable to provide a meaningful output.

According to certain aspects, some embodiments to be described in more detail below use the highly accurate current synthesizer outputs to predict the portion of the current sense ADC which needs to be converted for every conversion. This reduces the number of bits needed for the ADC, while overcoming the dV/dt limitation of the tracking ADC implementation described above in connection with FIG. 5C. More particularly, in general operation, the PWM modulator (e.g. 134 in FIG. 1) creates the PWM signal to be sent to the output power stage (e.g. 156 in FIG. 2) or directly to the FET's. The PWM modulator data is simultaneously sent to the current synthesizer (e.g. 182 in FIG. 5A) which uses setup and feedback data from the current sense ADC (e.g. 184 in FIG. 5A) to predict the resulting current. Due to the fact that the synthesizer receives the PWM waveform before the power stage receives, level shifts, and measures the resulting current, the synthesizer waveform is at least a few clock cycles ahead of the resulting analog waveform. Therefore, the synthesizer data can be fed-forward into the current sense ADC and used as a very accurate offset (replacing the MSB conversions), thereby requiring only the LSB's to be converted within the ADC, while overcoming the dV/dt limitation of the tracking ADC approach. This effectively minimizes the conversion time of the current sense ADC, allowing for a tradeoff between power, sample rate and clock frequency in the completed system. In a system in which many phases of current sense data are sampled by the same ADC (e.g. using a sharing scheme described in co-pending Application No. [SE-3158], the contents of which are incorporated by reference herein in their entirety), this allows for more data per ADC or a lower required clock rate. In some embodiments, if the current sense ADC saturates (either all high, or all low comparator decisions), the ADC can perform the next conversion in a low resolution mode, converting the MSB's instead of the LSB's in order to ensure the next sample gets converted with the full range (but lower resolution).

Figure 6A:
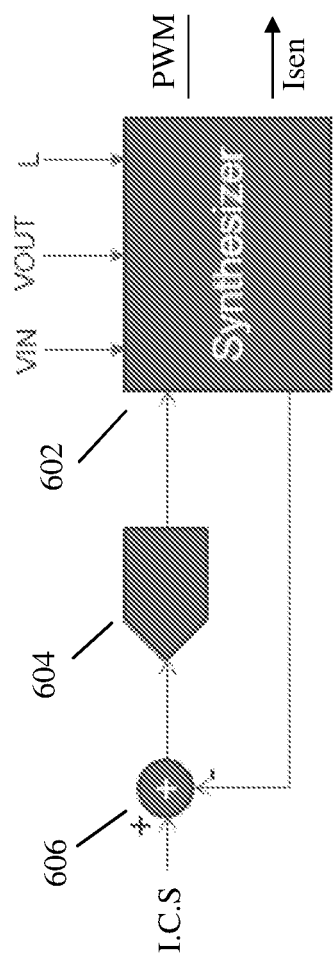
FIGS. 6A and 6B are block diagrams illustrating aspects of an example predictive current sensing technique according to embodiments.

FIG. 6A is a functional block diagram illustrating an example implementation of a predictive sampling scheme that can be used in a PWM converter or controller according to embodiments. According to certain general aspects, synthesizer 602 generates highly accurate current sense data Isen using both its own synthesized current, and measured current data from the output of ADC 604. As described above, synthesizer 602 receives measured values of VIN and VOUT from other controller components. Synthesizer 602 also receives the inductor value L in any of the ways described above, as well as the PWM modulator output. Based on the instantaneous PWM modulator output, synthesizer 602 predicts the inductor current using VIN, VOUT and L using known current synthesizer techniques as described above.

The predicted inductor current from synthesizer 602 is very accurate and valid for the duration of time until the PWM modulator output is reflected in the current at the inductor after being used to drive the output driver stage. Thus, when the corresponding measured inductor current signal arrives at 606 (e.g. an analog scaler, filter or subtractor), the predicted current from synthesizer 602 will likely be very close in value to the measured signal. The value of the MSB's of the predicted current are conceptually removed from the I.C.S. by 606, and the reduced value of the I.C.S. is provided to ADC 604. Because the dynamic range of the measured I.C.S. is reduced, only the LSB's of the inductor current need to be generated by ADC 604. These LSB's of the measured inductor current from ADC 604 are combined by synthesizer 602 with the MSB's of the predicted inductor current and used to provide the output current sense signal Isen. Meanwhile, the final value of the output current can also be used to perform synthesizer corrections, for example using the techniques of U.S. Pat. No. 9,419,627.

It should be noted that the inductor current sense signal (I.C.S.) can be obtained in various ways. For example, it can be obtained from a DCR circuit coupled to the inductor. In other embodiments, it can be obtained from a SENSEFET coupled to the low-side power transistor (e.g. 140, FIG. 1). Moreover, I.C.S. can be from one phase of a multi-phase controller (i.e. a non-shared ADC) or it can be from several different phases of a multi-phase controller (i.e. a shared ADC).

Figure 6B:
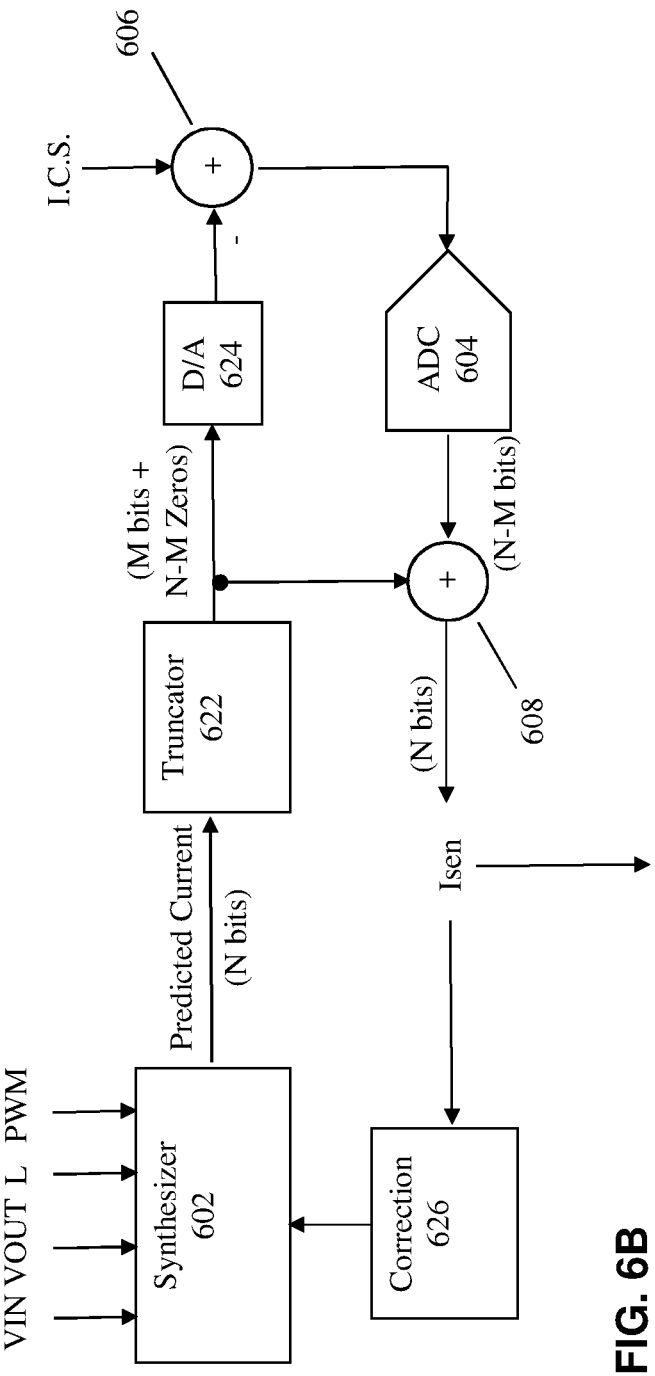

FIG. 6B is a functional block diagram illustrating aspects of an example implementation of a predictive sampling scheme such as that shown in FIG. 6A in alternative detail. As shown in FIG. 6B, for each sample, synthesizer 602 generates an N-bit estimate of current using, PWM, VIN, VOUT, L. The N-bit estimate is provided to truncator 622, which extracts the M most significant bits (MSB's) of the N-bit estimate and fills the remaining N-M least significant bits (LSBs) with zeroes. This modified N-bit predicted current estimate is provided to digital to analog converter 624, and the analog version of the predicted current is subtracted from the I.C.S. by 606. The output from 606 is provided to ADC 604 which produces an N-M bit digital output based on the output from 606. This N-M bit output (i.e. the LSB's) from ADC 604 is combined with the M bit truncated version of the predicted current (i.e. the MSB's) by combiner 608 (e.g. an analog scaler, filter or subtractor) to form a new N-bit estimate of the current Isen. The fully accurate N-bit Isen is used to perform synthesizer correction by block 626 as discussed in U.S. Pat. No. 9,419,627, and can also be provided to other components of PWM controller 152, as shown in FIG. 6B.

As set forth above, in some embodiments, in the case where ADC 604 saturates despite the accuracy of the predicted current, the dynamic range of ADC 604 can be set to the entire analog range of the inductor current, and the I.C.S. signal can be provided directly to ADC 604, bypassing 606. The low-resolution value (i.e. N-M bits rather than a full N bits) of the inductor current can then be interpolated and used to form the N-bit Isen. Thereafter, the dynamic range of ADC 604 can be reset to the lower dynamic range of the difference signal from 606.

FIGS. 7A and 7B are timing diagrams illustrating example aspects of the present embodiments. More particularly, FIG. 7A illustrates operational aspects of the tracking ADC as in FIG. 5C. Waveform 702 represents the actual inductor current in the phase being measured (i.e. I.C.S.), the current being generated in response to PWM waveforms (not shown). Brackets 704 indicate the quantizer range of ADC 504 in FIG. 5C at each sample point. As shown, the quantizer range of ADC 504 at a given sample point is centered around the output of ADC 504 at a previous sample point (i.e. captured at the intersection between the quantizer and waveform 702 at points 708, and represented by the dashed line to the left of each quantizer range represented by bracket 704). As can be seen, during a high dV/dt portion 706 of the current waveform 702, the ADC saturates and the outputs 710 of ADC 504 do not closely follow the inductor current waveform 702.

FIG. 7B illustrates operational aspects of the predictive ADC as shown in FIGS. 6A and 6B according to embodiments. Waveform 702 again represents the inductor current in the phase being measured, the current being generated in response to PWM waveforms (not shown). Brackets 714 indicate the quantizer range of ADC 604 in FIGS. 6A and 6B and waveform 716 indicates the output of synthesizer 602 in FIGS. 6A and 6B. As can be seen, synthesizer output 716 is very accurate and closely matches waveform 712, and so the quantizer range of ADC 604 at each sample point (centered on the waveform 716) is able to intersect with the waveform 702 even at high dV/dt portions such as 706, thereby allowing meaningful output samples to be produced by ADC 604.

Figure 8:
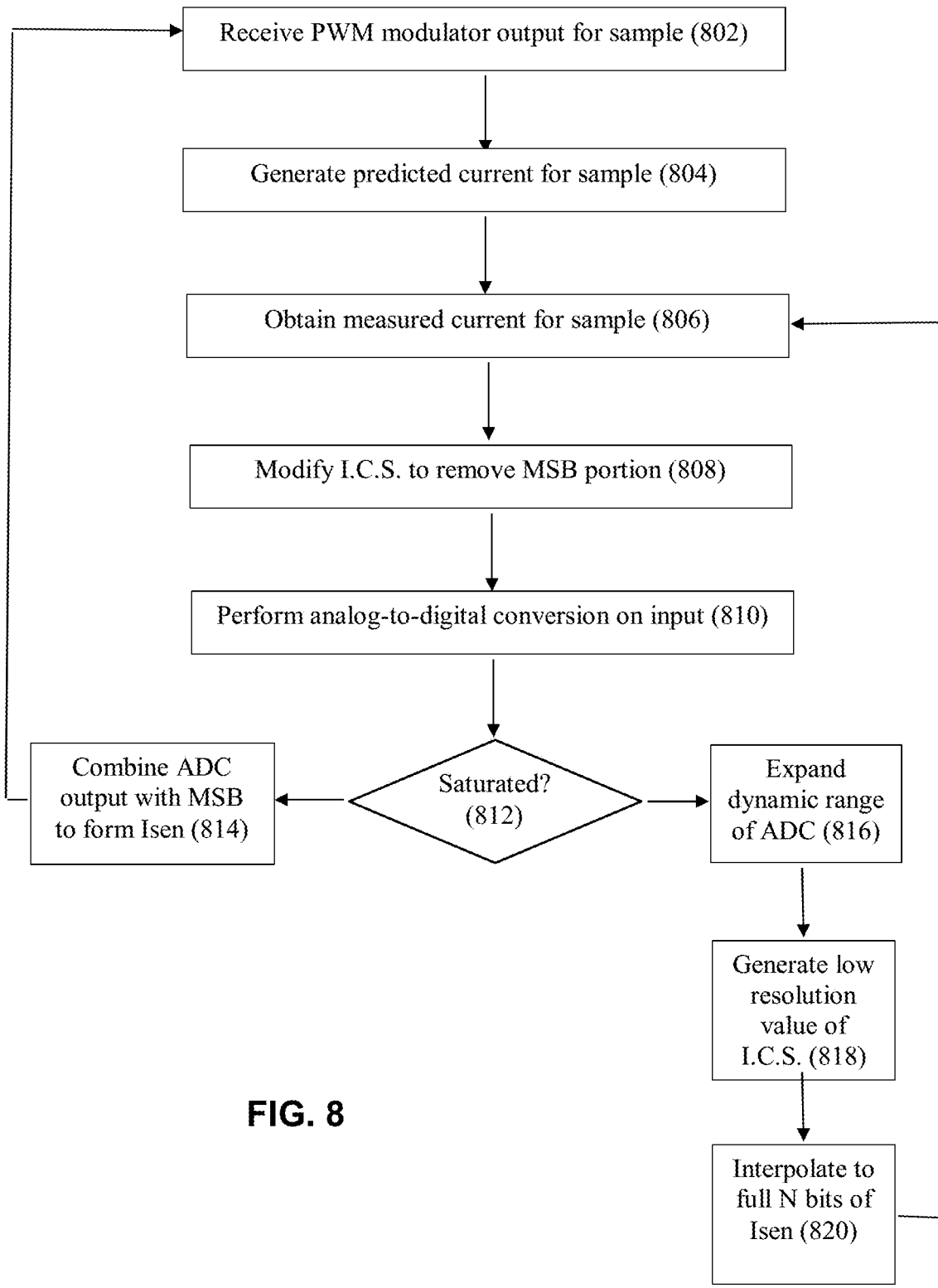
FIG. 8 is a flowchart illustrating an example predictive current sensing methodology according to embodiments.

FIG. 8 is a flowchart illustrating an example methodology according to embodiments.

In block 802, the current synthesizer (e.g. 602) receives the PWM modulator output (e.g. 134 in FIG. 1) for a given sample point. In block 804, the synthesizer (e.g. 602) generates the predicted current given the current state of the PWM modulator output, as well as values of VIN, VOUT and L as described above. In block 806, the I.C.S. for the sample point is obtained (e.g. from a DCR circuit, SENSEFET, etc.). In block 808, the I.C.S. is modified so as to remove the MSB portion of the predicted current. In block 810, the modified I.C.S. is sampled by the ADC (e.g. ADC 604) to produce LSB information.

In block 812, a check is made to determine whether the ADC saturated. If not, in block 814, the MSB portion of the predicted current is combined with the LSB information from the ADC to produce the final inductor current sample (i.e. Isen). In this case, processing returns to block 802.

If it was determined in block 812 that the ADC saturated, in block 816, the dynamic range of the ADC is expanded to the full dynamic range of the I.C.S. In block 818, the full I.C.S. is fed to the ADC, which generates a low-resolution N-M bit output, and which is interpolated/converted to full N bits in block 820. This is provided as the output value of Isen and is also used as the predicted current in next sample, and processing returns to block 806.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An apparatus for sampling signals in a power controller, comprising:
   an analog-to-digital converter (ADC) configured to sample an input signal, the input signal being associated with a sense signal from an output stage in the power controller;
   a synthesizer that predicts a value of the sense signal based on information about a pulse width modulation (PWM) waveform provided to the output stage;
   a filter that subtracts a portion of the predicted value of the sense signal from the sense signal to produce the input signal for the ADC; and
   a combiner that combines an output of the ADC with the portion of the predicted value of the sense signal to produce a measured value of the sense signal.

2. The apparatus of claim 1, wherein the filter is operative to reduce a conversion range of the ADC as compared to a full conversion range associated with the sense signal.

3. The apparatus of claim 1, wherein the predicted value corresponds to an N-bit digital representation of a current synthesizer output, and the portion of the predicted value of the sense signal comprises a zero padded N-bit value based on the N-bit digital representation.

4. The apparatus of claim 3, wherein the zero-padded N-bit value comprises the portion of the predicted value of the sense signal used by the combiner to produce the measured value.

5. The apparatus of claim 3, wherein the zero-padded N-bit value comprises N-M zero bits, and wherein the output of the ADC is N-M bits.

6. The apparatus of claim 3, further comprising a digital-to-analog converter (DAC) that receives the portion of the predicted value of the sense signal and produces the predicted value.

7. The apparatus of claim 1, wherein the sense signal comprises an inductor current sense signal.

8. The apparatus of claim 1, further comprising:
   a truncator that receives the predicted value of the sense signal and produces the portion of the predicted value of the sense signal.

9. The apparatus of claim 8, wherein the truncator produces the portion of the predicted value of the sense signal by converting M bits of the predicted value of the sense signal to zero.

10. A method for sampling signals in a power controller, comprising:
    producing a digital sample of an input signal, the input signal being associated with a sense signal from an output stage in the power controller;
    predicting a value of the sense signal based on information about a pulse width modulation (PWM) waveform provided to the output stage;
    subtracting a portion of the predicted value of the sense signal from the sense signal to produce the input signal; and
    combining the digital sample with the portion of the predicted value of the sense signal to produce a measured value of the sense signal.

11. The method of claim 10, wherein subtracting is performed to reduce a conversion range of an ADC as compared to a full conversion range associated with the sense signal.

12. The method of claim 10, further comprising:
    receiving an N-bit digital representation of a current synthesizer output corresponding to the predicted value of the sense signal;
    forming a zero padded N-bit value based on the N-bit digital representation; and
    using the zero padded N-bit value to form the portion of the predicted value of the sense signal.

13. The method of claim 12, wherein the zero-padded N-bit value comprises the portion of the predicted value of the sense signal used to produce the measured value.

14. The apparatus of claim 12, wherein the zero-padded N-bit value comprises N-M zero bits, and wherein the digital sample is N-M bits.

15. The method of claim 10, wherein the sense signal comprises an inductor current sense signal.

16. The method of claim 10, wherein producing the digital sample is performed by an analog-to-digital converter (ADC), the method comprising:
    determining by the ADC if the ADC reaches at least one of a predetermined high value and a predetermined low value when producing the digital sample; and
    if the ADC reaches at least one of the predetermined high value and the predetermined low value when producing the digital sample, forming a low resolution measurement of the sense signal to output in place of the measured value by converting a different portion of the predicted value of the sense signal than the input signal.

17. The method of claim 16, wherein forming the low resolution measurement includes directly sampling the sense signal using the ADC and interpolating an output of the ADC to form the low resolution measurement.

18. The method of claim 10, further comprising:
    converting M bits of the predicted value of the sense signal to zero to produce the portion of the predicted value of the sense signal.

19. A system for sampling signals in a power controller, comprising:
    an analog-to-digital converter (ADC) configured to sample an input signal, the input signal being associated with a sense signal from an output stage in the power controller;

a synthesizer that predicts a value of the sense signal based on information about a pulse width modulation (PWM) waveform provided to the output stage;

a truncator that receives the predicted value of the sense signal and produces a portion of the predicted value of the sense signal;

a filter that subtracts the portion of the predicted value of the sense signal from the sense signal to produce the input signal for the ADC; and a combiner that combines an output of the ADC with the portion of the predicted value of the sense signal to produce a measured value of the sense signal.

20. The method of claim 19, wherein the truncator is further configured to convert M bits of the predicted value of the sense signal to zero to produce the portion of the predicted value of the sense signal.

* * * * *